(12) United States Patent
Oh et al.

(10) Patent No.: US 12,376,396 B2
(45) Date of Patent: Jul. 29, 2025

(54) IMAGE SENSOR

(71) Applicant: DB HITEK CO., LTD., Seoul (KR)

(72) Inventors: Dong Jun Oh, Seoul (KR); Jong Min Kim, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 524 days.

(21) Appl. No.: 17/810,077

(22) Filed: Jun. 30, 2022

(65) Prior Publication Data

US 2023/0005974 A1    Jan. 5, 2023

(30) Foreign Application Priority Data

Jul. 2, 2021    (KR) .................. 10-2021-0087269

(51) Int. Cl.
*H10F 39/00*    (2025.01)

(52) U.S. Cl.
CPC ..... *H10F 39/8037* (2025.01); *H10F 39/8057* (2025.01); *H10F 39/807* (2025.01); *H10F 39/811* (2025.01)

(58) Field of Classification Search
None
See application file for complete search history.

(56) References Cited

U.S. PATENT DOCUMENTS

| | | | | |
|---|---|---|---|---|
| 2011/0074969 | A1* | 3/2011 | Takeda | H01L 27/14818 257/E31.124 |
| 2015/0270308 | A1* | 9/2015 | Choi | H01L 27/14685 257/292 |
| 2019/0297282 | A1* | 9/2019 | Tsutsui | H04N 25/622 |
| 2020/0366857 | A1* | 11/2020 | Choi | H01L 27/14612 |

FOREIGN PATENT DOCUMENTS

| | | | |
|---|---|---|---|
| JP | 2004165462 | A | 6/2004 |
| JP | 2008084962 | A * | 4/2008 |
| JP | 2011071437 | A | 4/2011 |
| JP | 2018110258 | | 6/2018 |
| KR | 1020100072661 | A | 7/2001 |
| KR | 20050106928 | A * | 11/2005 |
| KR | 10-1352436 | | 1/2014 |
| KR | 1020150108531 | A | 9/2015 |

(Continued)

OTHER PUBLICATIONS

English Translation of KR20050106928A (Year: 2005).*

(Continued)

*Primary Examiner* — Kretelia Graham
*Assistant Examiner* — Hamna Fathima Iqbal
(74) *Attorney, Agent, or Firm* — Husch Blackwell

(57) ABSTRACT

An image sensor includes a charge accumulation region disposed in a substrate and having a first conductivity type, a charge storage region disposed in the substrate to be spaced apart from the charge accumulation region and having the first conductivity type, a transfer gate electrode disposed on a channel region between the charge accumulation region and the charge storage region to transfer a charge from the charge accumulation region to the charge storage region, and a well region having a second conductivity type and disposed below the charge storage region to inhibit a charge generated below the charge storage region from being moved to the charge storage region.

19 Claims, 4 Drawing Sheets

(56) References Cited

FOREIGN PATENT DOCUMENTS

KR   10-2018-0129257       12/2018
KR    1020200130915 A      11/2020

OTHER PUBLICATIONS

English Translation_JP2008084962A (Year: 2008).*
Office Action for Korean Patent Application No. 10-2021-0087269 dated Nov. 12, 2023, 7 pages.
Office Action Summary translation for Korean Patent Application No. 10-2021-0087269 dated Nov. 12, 2023, 5 pages.

* cited by examiner

IMAGE SENSOR

CROSS-REFERENCE TO RELATED APPLICATION

This application claims the priority benefit of Korean Patent Application No. 10-2021-0087269, filed on Jul. 2, 2021, and all the benefits accruing therefrom under 35 U.S.C. § 119, the contents of which are incorporated by reference in their entirety.

TECHNICAL FIELD

The present disclosure relates to an image sensor. More specifically, the present disclosure relates to an image sensor including a photodiode and a charge storage region formed in a substrate.

BACKGROUND

In general, an image sensor is a semiconductor device that converts an optical image into electrical signals and may be classified or categorized as a Charge Coupled Device (CCD) or a Complementary Metal Oxide Semiconductor (CMOS) Image Sensor (CIS). The CIS may include unit pixels, each including a photodiode and MOS transistors. The CIS sequentially detects the electrical signals of the unit pixels using a switching method, thereby forming an image.

The photodiode may include a charge accumulation region in which charges generated by the incident light are accumulated. For example, the photodiode may include an N-type impurity region in which electrons are accumulated, and a P-type impurity region serving as a pinning region for reducing dark current may be formed on the N-type impurity region.

As an example, the image sensor may include a transfer gate electrode formed on a substrate, and the electrons may be transferred from the charge accumulation region to a charge detection region, for example, a floating diffusion region, through a channel region below the transfer gate electrode. As another example, an image sensor using a global shutter method may include a charge storage region for storing the electrons between the charge accumulation region and the floating diffusion region. In such cases, transfer gate electrodes may be formed on surface portions of the substrate among the charge accumulation region, the charge storage region and the floating diffusion region.

However, when light enters the charge storage region or a region below the charge storage region, electrons may be generated in the charge storage region or below the charge storage region. In particular, when the electrons generated below the charge storage region move to the charge storage region, operating characteristics of the image sensor may be deteriorated by the electrons.

SUMMARY

The present disclosure provides an image sensor capable of inhibiting charges generated below a charge storage region from moving to the charge storage region.

In accordance with an aspect of the present disclosure, an image sensor may include a charge accumulation region disposed in a substrate and having a first conductivity type, a charge storage region disposed in the substrate to be spaced apart from the charge accumulation region and having the first conductivity type, a transfer gate electrode disposed on a channel region between the charge accumulation region and the charge storage region to transfer a charge from the charge accumulation region to the charge storage region, and a well region having a second conductivity type and disposed below the charge storage region to inhibit a charge generated below the charge storage region from being moved to the charge storage region.

In accordance with some embodiments of the present disclosure, the image sensor may further include a second well region disposed below the well region and having the second conductivity type.

In accordance with some embodiments of the present disclosure, the second well region may have a width narrower than that of the well region.

In accordance with some embodiments of the present disclosure, the second well region may have an impurity concentration lower than that of the well region.

In accordance with some embodiments of the present disclosure, the substrate may have the second conductivity type and may have an impurity concentration lower than that of the second well region.

In accordance with some embodiments of the present disclosure, the image sensor may further include a third well region having the first conductivity type and disposed below the well region.

In accordance with some embodiments of the present disclosure, the third well region may have an impurity concentration lower than that of the charge accumulation region.

In accordance with some embodiments of the present disclosure, the third well region may be disposed below a portion of the well region adjacent to the charge accumulation region.

In accordance with some embodiments of the present disclosure, the image sensor may further include a fourth well region having the first conductivity type and disposed below a well region of an adjacent image cell.

In accordance with some embodiments of the present disclosure, the image sensor may further include a dummy pattern disposed on a surface portion of the substrate between the charge storage region and a charge accumulation region of an adjacent image cell and configured to inhibit light from entering the charge storage region from the adjacent image cell.

In accordance with some embodiments of the present disclosure, the dummy pattern may be made of the same material as the transfer gate electrode.

In accordance with some embodiments of the present disclosure, the dummy pattern may be made of polysilicon.

In accordance with some embodiments of the present disclosure, the image sensor may further include an insulating layer disposed on the substrate, the transfer gate electrode and the dummy pattern, and a light shield layer disposed on the insulating layer and inhibiting light from entering the charge storage region.

In accordance with some embodiments of the present disclosure, the image sensor may further include a light shield pattern disposed between the dummy pattern and the light shield layer to pass through the insulating layer.

In accordance with some embodiments of the present disclosure, the image sensor may further include a second light shield pattern extending from a first edge portion of the light shield layer adjacent to the adjacent image cell toward the substrate.

In accordance with some embodiments of the present disclosure, the image sensor may further include a third light shield pattern extending from a second edge portion of the light shield layer adjacent to the charge accumulation region toward the substrate.

In accordance with some embodiments of the present disclosure, the image sensor may further include a second insulating layer disposed on the insulating layer and the light shield layer, interlayer insulating layers disposed on the second insulating layer, metal wiring layers disposed among the interlayer insulating layers, and a light guide pattern passing through the interlayer insulating layers and corresponding to the charge accumulation region.

In accordance with some embodiments of the present disclosure, the image sensor may further include an isolation region disposed in the surface portion of the substrate between the charge storage region and the charge accumulation region of the adjacent image cell. In such case, the dummy pattern may be disposed on the isolation region.

In accordance with some embodiments of the present disclosure, the image sensor may further include a second dummy pattern disposed on the charge storage region and configured to inhibit light from entering the charge storage region, and an insulating layer disposed between the charge storage region and the second dummy pattern and configured to electrically insulate the charge storage region from the second dummy pattern.

In accordance with some embodiments of the present disclosure, the second dummy pattern may be made of the same material as the dummy pattern.

In accordance with the embodiments of the present disclosure as described above, charges generated below the charge storage region may move to the charge accumulation region by internal potential differences among the well region, the second well region and the substrate. In particular, the movement of the charges to the charge accumulation region may be facilitated by the third well region and the fourth well region, and thus, the dynamic range, crosstalk, and parasitic light sensitivity of the image sensor may be significantly improved.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
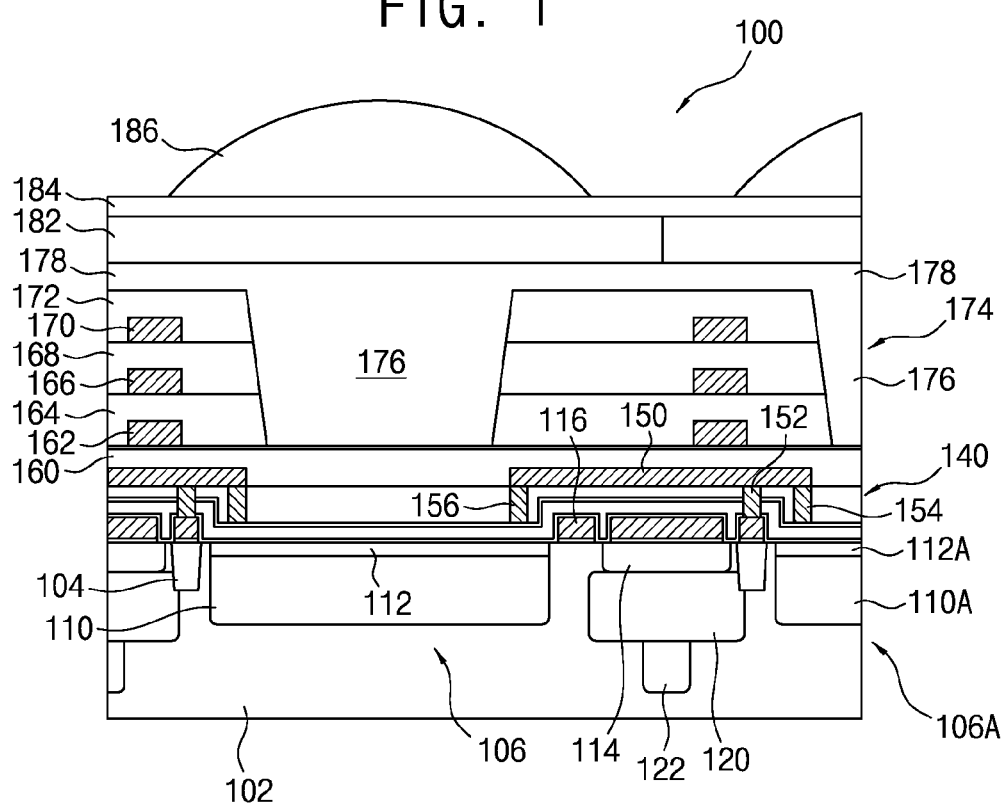
FIG. 1 is a schematic cross-sectional view illustrating an image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. In contrast, it will be understood that when one component is referred to as directly being on or directly connected to another component or layer, it means that no intervening component is present. Also, though terms like a first, a second, and a third are used to describe various regions and layers in various embodiments of the present disclosure, the numbers and orders of the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of idealized embodiments. Accordingly, changes in manufacturing methods and/or allowable errors may be expected from the forms of the drawings. Accordingly, embodiments of the present disclosure are not described being limited to the specific forms or areas in the drawings and include the deviations of the forms. The areas may be entirely schematic, and their forms may not describe or depict accurate forms or structures in any given area and are not intended to limit the scope of the present disclosure.

Figure 2:
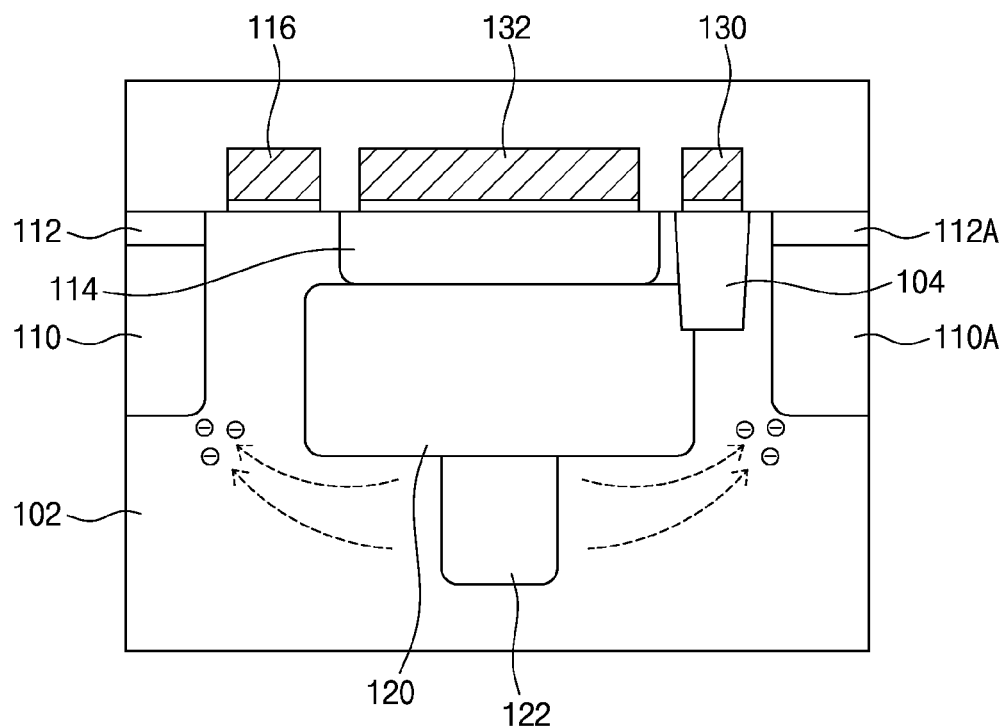
FIG. 2 is a schematic enlarged cross-sectional view illustrating a well region and a second well region as shown in FIG. 1.

FIG. 1 is a schematic cross-sectional view illustrating an image sensor in accordance with an embodiment of the present disclosure. FIG. 2 is a schematic enlarged cross-sectional view illustrating a well region and a second well region as shown in FIG. 1, and FIG. 3 is a schematic enlarged cross-sectional view illustrating a dummy pattern, a light shield pattern and a second light shield pattern as shown in FIG. 1.

Figure 3:
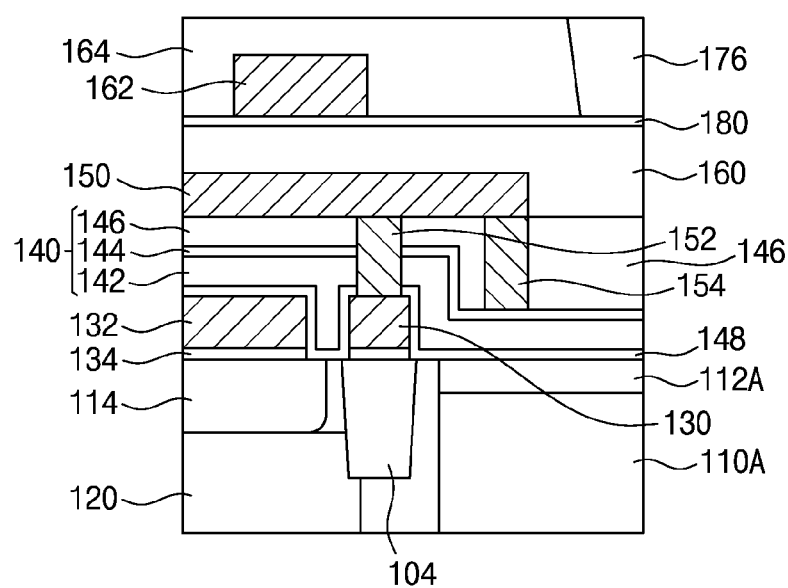
FIG. 3 is a schematic enlarged cross-sectional view illustrating a dummy pattern, a light shield pattern and a second light shield pattern as shown in FIG. 1.

Referring to FIGS. 1 to 3, an image sensor 100, in accordance with an embodiment of the present disclosure, may include a plurality of image cells 106, and isolation regions 104 for electrically isolating the image cells 106. Each of the image cells 106 may include a charge accumulation region 110 formed in a substrate 102, a charge storage region 114 formed in the substrate 102 to be spaced apart from the charge accumulation region 110, and a transfer gate electrode 116 formed on a channel region between the charge accumulation region 110 and the charge storage region 114 to transfer charges from the charge accumulation region 110 to the charge storage region 114.

The charge accumulation region 110 may have a first conductivity type, and the substrate 102 may have a second conductivity type. For example, an N-type impurity diffusion region may be used as the charge accumulation region 110, and a P-type substrate may be used as the substrate 102. The charge storage region 114 may have the first conductivity type. For example, an N-type impurity diffusion region may be used as the charge storage region 114. Alternatively, a P-type epitaxial layer (not shown) may be formed on the substrate 102. In such case, the charge accumulation region 110 and the charge storage region 114 may be formed in the P-type epitaxial layer.

A pinning layer 112 having the second conductivity type may be formed on the charge accumulation region 110. For example, a P-type impurity diffusion region may be used as the pinning layer 112. That is, the image sensor 100 may include a pinned photodiode (PD) including the charge accumulation region 110 and the pinning layer 112.

Although not shown in figures, the image sensor 100 may include a floating diffusion region spaced apart from the charge storage region 114, and a second transfer gate electrode may be formed on a second channel region between the charge storage region 114 and the floating diffusion region. In addition, the image sensor 100 may include a reset gate electrode, a source follower gate electrode, and a selection gate electrode, and impurity diffusion regions serving as source/drain regions may be formed in surface portions of the substrate 102 adjacent to the reset gate electrode, the source follower gate electrode, and the selection gate electrode. Further, gate insulating layers made of silicon oxide may be formed between the electrodes and the substrate 102.

In accordance with an embodiment of the present disclosure, a well region 120 may be disposed below the charge storage region 114 in order to inhibit charges generated below the charge storage region 114 from being moved to the charge storage region 114. The well region 120 may have the second conductivity type. For example, the well region 120 may be a P-type impurity diffusion region and may be formed by an ion implantation process. In particular, a second well region 122 may be formed below the well region 120. For example, the second well region 122 may be formed under a central portion of the well region 120 and may have a width narrower than that of the well region 120. In addition, the second well region 122 may have the second conductivity type. For example, the second well region 122 may be a P-type impurity diffusion region having an impurity concentration lower than that of the well region 120. In such case, the substrate 102 may have an impurity concentration lower than the second well region 122.

The image sensor 100 may include an image cell 106A adjacent the charge storage region 114. The adjacent image cell 106A may include a pinned photodiode comprising a charge accumulation region 110A and a pinning layer 112A. The well region 120 and the second well region 122 may function as isolation regions for electrically isolating between the image cell 106 and the adjacent image cell 106A. Particularly, as shown in FIG. 2, electrons generated below the charge storage region 114 may move to the charge accumulation region 110 of the image cell 106 or the charge accumulation region 110A of the adjacent image cell 106A by internal potential differences among the well region 120, the second well region 122, and the substrate 102. As a result, the electrons generated below the charge storage region 114 may be inhibited from moving to the charge storage region 114, and accordingly the dynamic range, crosstalk, and parasitic light sensitivity of the image sensor 100 may be significantly improved.

In accordance with an embodiment of the present disclosure, the image sensor 100 may include a dummy pattern 130 disposed on a surface portion of the substrate 102 between the charge storage region 114 and the charge accumulation region 110A of the adjacent image cell 106A and configured to inhibit light from entering the charge storage region 114 from the adjacent image cell 106A.

The dummy pattern 130 may be formed of the same material as the transfer gate electrode 116 and simultaneously with the transfer gate electrode 116. For example, the dummy pattern 130 and the transfer gate electrode 116 may be made of polysilicon doped with impurities, and the light from the adjacent image cell 106A toward the charge storage region 114 may be absorbed by the dummy pattern 130. That is, the dummy pattern 130 may function as a light absorption pattern for absorbing the light, thereby inhibiting the light from being introduced into the charge storage region 114. In embodiments, after forming a silicon oxide layer and an impurity-doped polysilicon layer on the substrate 102, the transfer gate electrode 116 and the dummy pattern 130 may be formed by patterning the polysilicon layer and the silicon oxide layer.

Further, a second dummy pattern 132 for inhibiting light from being introduced into the charge storage region 114 may be formed on the charge storage region 114. For example, the second dummy pattern 132 may be formed of the same material as the transfer gate electrode 116 and simultaneously with the transfer gate electrode 116. As shown in FIG. 3, an insulating layer 134 such as a silicon oxide layer may be formed between the second dummy pattern 132 and the charge storage region 114, and the second dummy pattern 132 and the charge storage region 114 may be electrically insulated from each other by the insulating layer 134.

An insulating layer 140 may be formed on the substrate 102, the transfer gate electrode 116, the dummy pattern 130, and the second dummy pattern 132. The insulating layer 140 may include a first oxide layer 142 formed on the substrate 102, the transfer gate electrode 116, the dummy pattern 130, and the second dummy pattern 132, a nitride layer 144 formed on the first oxide layer 142, and a second oxide layer 146 formed on the nitride layer 144. For example, the insulating layer 140 may include a first silicon oxide layer 142 formed on the substrate 102, the transfer gate electrode 116, the dummy pattern 130, and the second dummy pattern 132, a silicon nitride layer 144 formed on the first silicon oxide layer 142, and a second silicon oxide layer 146 formed on the silicon nitride layer 144. Further, an anti-reflective layer 148 may be formed between the substrate 102 and the insulating layer 140. In embodiments, the anti-reflective layer 148 may be formed of silicon nitride.

A light shield layer 150 for inhibiting light from entering the charge storage region 114 may be formed on the insulating layer 140. The light shield layer 150 may be made of a metal, for example, aluminum. In particular, a light shield pattern 152 penetrating the insulating layer 140 may be formed between the dummy pattern 130 and the light shield layer 150. The light shield pattern 152 may be formed of a metal, for example, tungsten or copper. Accordingly, the light from the adjacent image cell 106A toward the charge storage region 114 may be reflected by the light shield pattern 152. That is, the light shield pattern 152 may function as a light reflection pattern. For example, an isolation region 104 may be formed between the charge storage region 114 and the charge accumulation region 110A of the adjacent image cell 106A, and the dummy pattern 130 may be formed on the isolation region 104. Further, the light shield pattern 152 may be formed on the dummy pattern 130, and the light shield layer 150 may be formed on the insulating layer 140 and the light shield pattern 152.

In accordance with an embodiment of the present disclosure, as shown in FIGS. 1 and 3, the image sensor 100 may include a second light shield pattern 154 extending from a first edge portion of the light shield layer 150 adjacent to the adjacent image cell 106A toward the substrate 102, and a third light shield pattern 156 extending from a second edge portion of the light shield layer 150 adjacent to the charge accumulation region 110 toward the substrate 102. For example, the second and third light shield patterns 154 and 156 may be formed to pass through the second silicon oxide layer 146. Further, the second and third light shield patterns 154 and 156 may be made of the same material as the light shield pattern 152. For example, the second and third light shield patterns 154 and 156 may be formed of a metal such as tungsten or copper. In such a case, the silicon nitride layer 144 may function as an etch stop layer in an anisotropic etching process for forming the second and third light shield patterns 154 and 156.

A second insulating layer 160 may be formed on the insulating layer 140 and the light shield layer 150. In embodiments, a silicon oxide layer may be used as the second insulating layer 160. Further, a plurality of metal wiring layers 162, 166 and 170, and interlayer insulating layers 164, 168 and 172 may be formed on the second insulating layer 160. For example, a first metal wiring layer 162 may be formed on the second insulating layer 160, and a first interlayer insulating layer 164 may be formed on the second insulating layer 160 and the first metal wiring layer 162. A second metal wiring layer 166 may be formed on the first interlayer insulating layer 164, and a second interlayer insulating layer 168 may be formed on the first interlayer insulating layer 164 and the second metal wiring layer 166. A third metal wiring layer 170 may be formed on the second interlayer insulating layer 168, and a third interlayer insulating layer 172 may be formed on the second interlayer insulating layer 168 and the third metal wiring layer 170.

In accordance with an embodiment of the present disclosure, the image sensor 100 may include a light guide pattern layer 174 passing through the interlayer insulating layers 164, 168 and 172. Specifically, the light guide pattern layer 174 may include light guide patterns 176 passing through the interlayer insulating layers 164, 168 and 172, and a planarization layer 178 formed on the third interlayer insulating layer 172 and the light guide patterns 176. In embodiments, the light guide pattern layer 174 may be formed of a dielectric material having a refractive index greater than that of silicon oxide forming the interlayer insulating layers 164, 168 and 172.

An etch stop layer 180 made of silicon nitride may be formed on the second insulating layer 160, as shown in FIG. 3. For example, in an anisotropic etching process for forming the light guide patterns 176, the interlayer insulating layers 164, 168 and 172 may be partially removed until the etch stop layer 180 is exposed, and the light guide patterns 176 may be formed in through holes formed by the anisotropic etching process. As a result, the light guide patterns 176 may be formed on the etch stop layer 180.

Alternatively, although not shown, the light guide patterns 176 may extend to the silicon nitride layer 144. That is, in an anisotropic etching process for forming the light guide patterns 176, the interlayer insulating layers 164, 168 and 172, the second insulating layer 160, and the second silicon oxide layer 146 may be partially removed until the silicon nitride layer 144 is exposed. In such case, in the anisotropic etching process, the silicon nitride layer 144 may be used as an etch stop layer, and the etch stop layer 180 may be omitted. The light guide patterns 176 may be formed on the silicon nitride layer 144 through the interlayer insulating layers 164, 168 and 172, the second insulating layer 160, and the second silicon oxide layer 146, thereby reducing a distance between the pinned photodiodes and the light guide patterns 176.

The light guide patterns 176 may be arranged to correspond to the charge accumulation regions 110, and a color filter layer 182 including a plurality of color filters may be formed on the light guide pattern layer 174. A second planarization layer 184 may be formed on the color filter layer 182, and a microlens array 186 may be formed on the second planarization layer 184.

In accordance with the embodiment of the present disclosure as described above, the light from the adjacent image cell 106A toward the charge storage region 114 may be blocked by the second light shield pattern 154. Further, the light directed to the charge storage region 114 through between the second light shield pattern 154 and the substrate 102 may be blocked by the dummy pattern 130 and the light shield pattern 152. Accordingly, the light entering the charge storage region 114 may be significantly reduced, and thus, the dynamic range, crosstalk, and parasitic light sensitivity of the image sensor 100 may be greatly improved.

Figure 4:
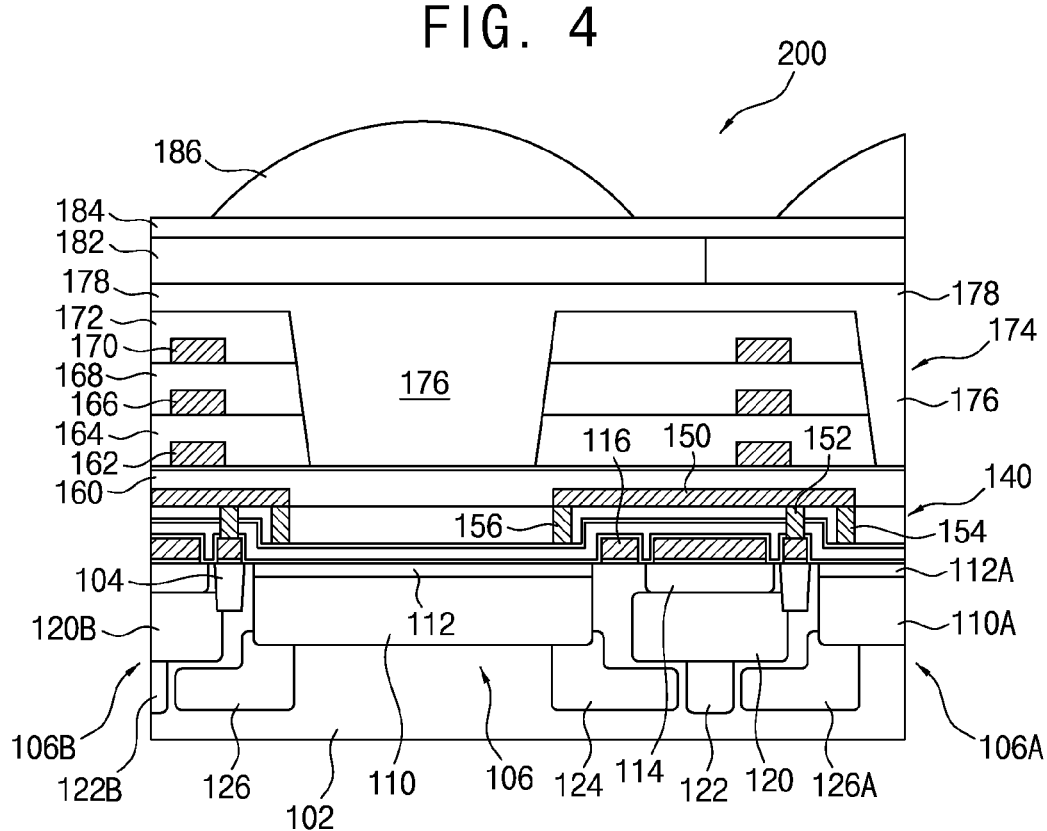
FIG. 4 is a schematic cross-sectional view illustrating an image sensor in accordance with another embodiment of the present disclosure.
Figure 5:
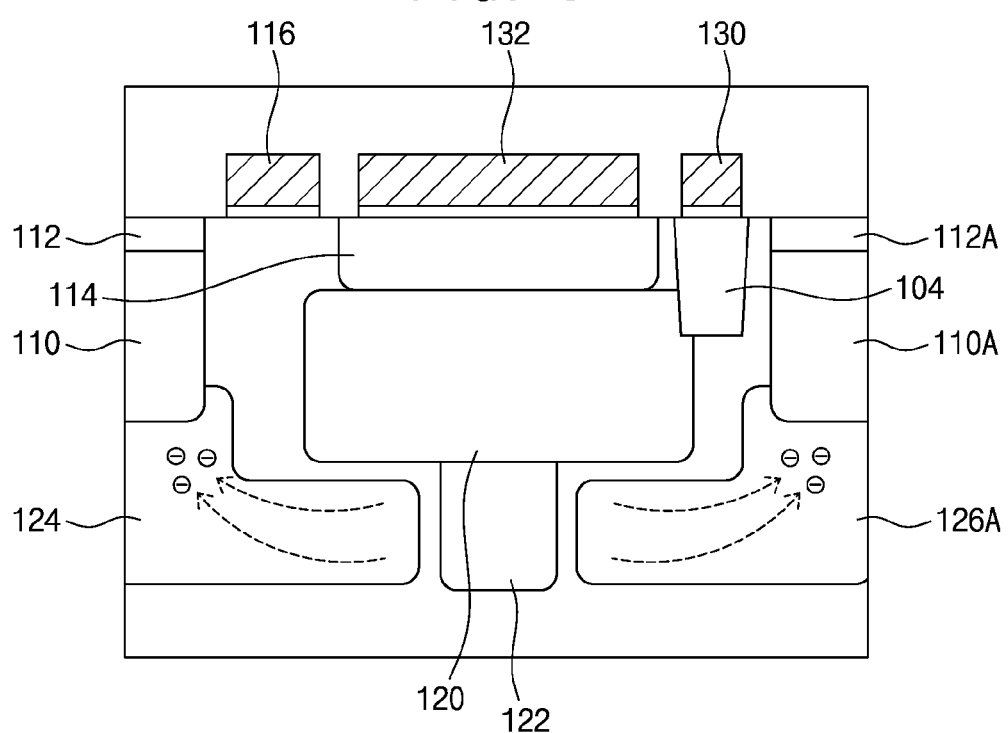
FIG. 5 is a schematic enlarged cross-sectional view illustrating a third well region and a fourth well region as shown in FIG. 4.

FIG. 4 is a schematic cross-sectional view illustrating an image sensor in accordance with another embodiment of the present disclosure, and FIG. 5 is a schematic enlarged cross-sectional view illustrating a third well region and a fourth well region as shown in FIG. 4.

Referring to FIGS. 4 and 5, an image sensor 200, in accordance with another embodiment of the present disclosure, may include a charge accumulation region 110 formed in a substrate 102 and having a first conductivity type, a charge storage region 114 formed to be spaced apart from the charge accumulation region 110 and having the first conductivity type, and a transfer gate electrode 116 formed on a channel region between the charge accumulation region 110 and the charge storage region 114. A well region 120 having a second conductivity type may be formed below the charge storage region 114, and a second well region 122 having the second conductivity type and an impurity concentration lower than that of the well region 120 may be formed under a central portion of the well region 120.

In accordance with another embodiment of the present disclosure, the image sensor 200 may include a third well region 124 for moving electrons generated below the charge storage region 114 to the charge accumulation region 110. The third well region 124 may have the first conductivity type and may be connected to the charge accumulation region 110. For example, the third well region 124 may be an N-type impurity diffusion region formed by an ion implantation process. In particular, the third well region 124 may have a lower impurity concentration than that of the charge accumulation region 110. Further, as shown in FIG. 5, the third well region 124 may be formed to be adjacent to the second well region 122 below a portion of the well region 120 adjacent to the charge accumulation region 110.

Further, the image sensor 200 may include a fourth well region 126 formed below a well region 120B of another adjacent image cell 106B. The fourth well region 126 may have the first conductivity type and may be connected to the charge accumulation region 110. For example, the fourth well region 126 may be an N-type impurity diffusion region formed by an ion implantation process, and may have a lower impurity concentration than the charge accumulation region 110. Further, as shown in FIG. 4, the fourth well region 126 may be formed to be adjacent to a second well region 122B of the another adjacent image cell 106B below a portion of the well region 120B of the another adjacent image cell 106B adjacent to the charge accumulation region 110. In particular, the fourth well region 126 may have the same impurity concentration as that of the third well region 124, and may be formed simultaneously with the third well region 124.

Accordingly, as shown in FIG. 5, electrons generated below the charge storage region 114 may move to the charge accumulation region 110 of the image cell 106 and a charge accumulation region 110A of an adjacent image cell 106A through the third well region 124 and a fourth well region 126A of the adjacent image cell 106A, respectively. As a result, the electrons generated below the charge storage region 114 may be inhibited from moving to the charge storage region 114, and thus, the dynamic range, crosstalk, and parasitic light sensitivity of the image sensor 200 may be greatly improved.

Although the example embodiments of the present disclosure have been described with reference to the specific embodiments, they are not limited thereto. Therefore, it will be readily understood by those skilled in the art that various modifications and changes can be made thereto without departing from the spirit and scope of the present disclosure defined by the appended claims.

What is claimed is:

1. An image sensor comprising:
a charge accumulation region disposed in a substrate and having a first conductivity type; a charge storage region disposed in the substrate to be spaced apart from the charge accumulation region and having the first conductivity type;
a transfer gate electrode disposed on a channel region between the charge accumulation region and the charge storage region to transfer a charge from the charge accumulation region to the charge storage region;
a well region having a second conductivity type and disposed below the charge storage region to prevent a charge generated below the charge storage region from being moved to the charge storage region; and
a third well region having the first conductivity type and disposed below the well region.

2. The image sensor of claim 1, further comprising:
a second well region disposed below the well region and having the second conductivity type.

3. The image sensor of claim 2, wherein the second well region has a width narrower than that of the well region.

4. The image sensor of claim 2, wherein the second well region has an impurity concentration lower than that of the well region.

5. The image sensor of claim 4, wherein the substrate has the second conductivity type and has an impurity concentration lower than that of the second well region.

6. An The image sensor of claim 1, wherein the third well region has an impurity concentration lower than that of the charge accumulation region.

7. An The image sensor of claim 1, wherein the third well region is disposed below a portion of the well region adjacent to the charge accumulation region.

8. An The image sensor of claim 1, further comprising:
a fourth well region having the first conductivity type and disposed below a well region of an adjacent image cell.

9. The image sensor of claim 1, further comprising:
a dummy pattern disposed on a surface portion of the substrate between the charge storage region and a charge accumulation region of an adjacent image cell and configured to prevent light from entering the charge storage region from the adjacent image cell.

10. The image sensor of claim 9, wherein the dummy pattern is made of a same material as the transfer gate electrode.

11. The image sensor of claim 10, wherein the dummy pattern is made of polysilicon.

12. The image sensor of claim 9, further comprising:
an insulating layer disposed on the substrate, the transfer gate electrode and the dummy pattern; and
a light shield layer disposed on the insulating layer and preventing light from entering the charge storage region.

13. The image sensor of claim 12, further comprising:
a light shield pattern disposed between the dummy pattern and the light shield layer to pass through the insulating layer.

14. The image sensor of claim 13, further comprising:
a second light shield pattern extending from a first edge portion of the light shield layer adjacent to the adjacent image cell toward the substrate.

15. The image sensor of claim 13, further comprising:
a third light shield pattern extending from a second edge portion of the light shield layer adjacent to the charge accumulation region toward the substrate.

16. The image sensor of claim 12, further comprising:
a second insulating layer disposed on the insulating layer and the light shield layer; interlayer insulating layers disposed on the second insulating layer;
metal wiring layers disposed among the interlayer insulating layers; and
a light guide pattern passing through the interlayer insulating layers and corresponding to the charge accumulation region.

17. The image sensor of claim 9, further comprising:
an isolation region disposed in the surface portion of the substrate between the charge storage region and the charge accumulation region of the adjacent image cell,
wherein the dummy pattern is disposed on the isolation region.

18. The image sensor of claim 9, further comprising:
a second dummy pattern disposed on the charge storage region and configured to prevent light from entering the charge storage region; and
an insulating layer disposed between the charge storage region and the second dummy pattern and configured to electrically insulate the charge storage region from the second dummy pattern.

19. The image sensor of claim 18, wherein the second dummy pattern is made of a same material as the dummy pattern.

* * * * *